United States Patent
Chen et al.

(10) Patent No.: US 11,437,991 B2
(45) Date of Patent: Sep. 6, 2022

(54) CONTROL CIRCUIT FOR POWER SWITCH

(71) Applicant: Airoha Technology Corp., Hsinchu (TW)

(72) Inventors: Hung-I Chen, Taoyuan (TW); Yu-Hua Liu, Hsinchu (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 17/313,039

(22) Filed: May 6, 2021

(65) Prior Publication Data
US 2021/0359679 A1 Nov. 18, 2021

(30) Foreign Application Priority Data

May 14, 2020 (TW) ................. 109116090

(51) Int. Cl.
*H03K 17/687* (2006.01)
*H04W 52/02* (2009.01)

(52) U.S. Cl.
CPC ..... *H03K 17/6872* (2013.01); *H03K 17/6874* (2013.01); *H04W 52/0296* (2013.01)

(58) Field of Classification Search
CPC ........... H03K 17/6872; H03K 17/6874; H03K 2217/0027; H03K 17/0822; H03K 17/6871; H03K 17/687; H03K 17/082; H03K 17/693; H04W 52/0296; H04W 52/0261
See application file for complete search history.

(56) References Cited

U.S. PATENT DOCUMENTS

| | | | |
|---|---|---|---|
| 8,830,769 B2 | 9/2014 | Lee | |
| 9,092,043 B2 | 7/2015 | Nascimento | |
| 9,715,245 B2 | 7/2017 | Yen et al. | |
| 2006/0033536 A1* | 2/2006 | Thelen | H03K 17/687 327/108 |

FOREIGN PATENT DOCUMENTS

| | | |
|---|---|---|
| CN | 103456344 A | 12/2013 |
| CN | 106200732 A | 12/2016 |

OTHER PUBLICATIONS

Chinese language office action dated Jul. 1, 2022, issued in application No. CN 202010495656.0.

* cited by examiner

*Primary Examiner* — Jung Kim
(74) *Attorney, Agent, or Firm* — McClure, Qualey & Rodack, LLP (57) ABSTRACT

A control circuit for a main switch is provided. The control circuit includes an output voltage tracker, a main switch bias generator, and a reference current device. The output voltage tracker is coupled to the main output end and generates a first tracking voltage positively correlated to an output voltage. The main switch bias generator, in response to the first tracking voltage, generates a second tracking voltage substantially equal to the output voltage. The reference current device is coupled to the main switch bias generator and is used to generate a control voltage on a main control end. The reference current device is used to limit the maximum value of the output current. The main switch and a duplicating switching element of the main switch bias generator form a current mirror configuration circuit. The consuming current of the output voltage tracker is positively correlated to the output current.

13 Claims, 5 Drawing Sheets

CONTROL CIRCUIT FOR POWER SWITCH

This application claims the benefit of Taiwan application Serial No. 109116090, filed May 14, 2020, the subject matter of which is incorporated herein by reference.

BACKGROUND OF THE INVENTION

Field of the Invention

The invention relates in general to a control circuit, and more particularly to a control circuit for a power switch.

Description of the Related Art

According to whether an external power source is available to provide power, an ordinary portable device (such as a mobile phone or a Bluetooth earbud) can switch to different ways of power supplying. For example, the portable device can select to be powered by an external power source or an internal power source (such as a re-chargeable battery). Let the Bluetooth earbud be taken for example. When the Bluetooth earbud is connected to the external power source, the Bluetooth earbud switches a power supply path such that the external power source provides necessary power to the Bluetooth earbud and at the same time can charge an internal battery of the Bluetooth earbud, When the Bluetooth earbud is not connected to the external power source, the Bluetooth earbud switches the power supply path such that the internal battery of the Bluetooth earbud provides necessary power for operations performed by internal elements of the Bluetooth earbud.

SUMMARY OF THE INVENTION

The invention is directed to a control circuit for a main switch. The main switch has a main input end, a main output end and a main control end.

The main input end receives an input voltage. The main output end generates an output voltage and supplies an output current. The control circuit includes an output voltage tracker, a main switch bias generator, and a reference current device. The output voltage tracker is coupled to the main output end and configured to generate a first tracking voltage positively correlated to the output voltage. The output voltage tracker has a consuming current. When the output voltage decreases, the first tracking voltage decreases accordingly. The main switch bias generator has a duplicating switching element. A second end and a control end of the duplicating switching element are coupled to the main input end and the main control end respectively. The main switch bias generator, in response to the first tracking voltage, generates a second tracking voltage substantially equal to the output voltage. The second tracking voltage is the voltage at a first end of the duplicating switching element. The reference current device is coupled to the main switch bias generator and is configured to generate a control voltage on the main control end. The reference current device further turns on the main switch by the control voltage and is configured to limit the maximum value of the output current. The main switch and the duplicating switching element form a current mirror configuration circuit. The current mirror configuration circuit uses the main control end as a current mirror input end. The current mirror configuration circuit uses the main output end as a current mirror output end. The consuming current of the output voltage tracker is positively correlated to the output current. When the output current increases, the consuming current increases accordingly.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
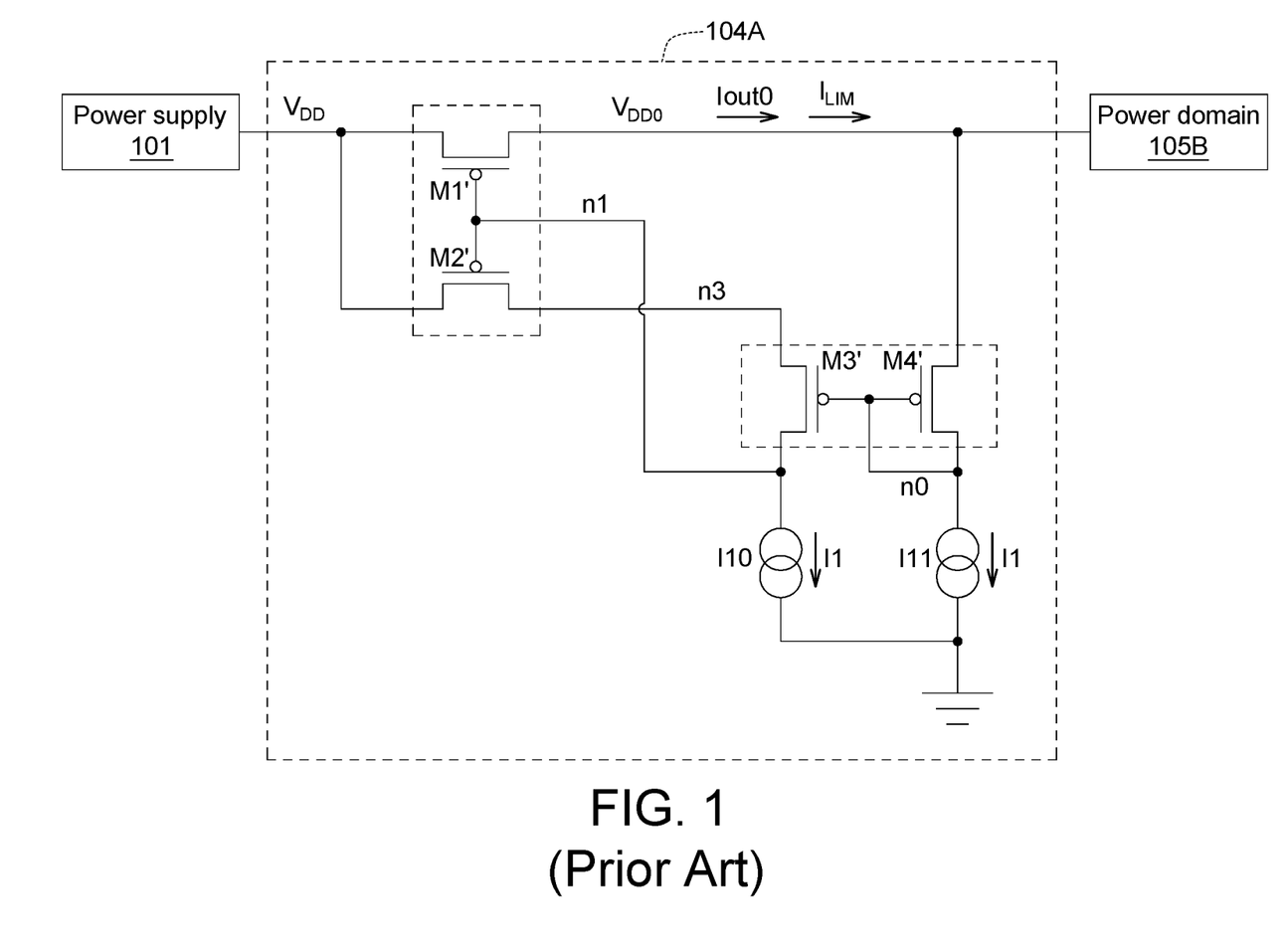
FIG. 1 is a block diagram of a power switch circuit disclosed in the U.S. Pat. No. 9,092,043

Referring to FIG. 1, a block diagram of a power switch circuit disclosed in the U.S. Pat. No. 9,092,043 is shown (referring to FIG. 2 of the U.S. Pat. No. 9,092,043). The switch circuit 104A is coupled between the power supply 101 and the power domain 105B. The power supply 101 provides a voltage $V_{DD}$ to the transistor M1', which then outputs a voltage $V_{DD0}$ to the power domain 105B. The switch circuit 104A provides only an electrical current with limited amount to the power domain 105B, and the limited amount of electrical current provided to the power domain 105B is denoted by $I_{LIM}$. $I_{LIM}$ can be expressed as:

$$I_{LIM} = I1 \frac{W_1/L_1}{W_2/L_2}$$

Where I1 represents current at drain of each of the transistors M3' and M4'; $W_1$ and $L_1$ respectively represent a channel width and a channel length of the transistor M1'; and, $W_2$ and $L_2$ respectively represent a channel width and channel length of the transistor M2'. In short, $I_{LIM}$ is a function of I1 and an aspect ratio of both transistors M1' and M2'.

However, the switch circuit 104A disclosed in the U.S. Pat. No. 9,092,043 still has the following problems. The switch circuit 104A provides the bias current I1 in the switch circuit 104A by using the current sources I10 and I11. If the value of the bias current I1 is designed to be very small for the purpose of power saving, the response speed of the switch circuit 104A may not be fast enough. For example, given that I1=0.5 uA, when an output node is short-circuited to ground, charges in gates of the transistors M1' and M2' needs to be removed through the current source I10 and the charge in the gates of the transistors M3' and M4' needs to be removed through the current source I11. When a value of the bias current I1 is not large enough, the aforesaid operation of removing the charges in the gate of the transistor M1' to the transistor M4' may take a longer time. Conversely, when a value of the bias current I1 is too large, magnitude of a static current flowing through the transistor M3' and the transistor M4' is increased and a static power consumption will be increased accordingly.

To increase the limited amount of electrical current $I_{LIM}$, it is required to increase a value of $I_{LIM}/I1$ by means of a high ratio of an aspect ratio of transistor M1' to an aspect ratio of the transistor M2'. However, in circuit design, such high ratio might be laborious to achieve. For example, given that $I1=0.5$ uA and $I_{LIM}=800$ mA, then $I_{LIM}/I1=1,600,000$. To achieve $I_{LIM}/I1=1,600,000$, a ratio of an aspect ratio of the transistors M1' to an aspect ratio of the transistor M2' needs to be 1,600,000 ($W_1/L_1:W_2/L_2=1,600,000:1$). Thus, for the circuit shown in FIG. 1, when the limited amount of electrical current $I_{LIM}$ needs to be increased, a value of the current I1 also needs to be increased. However, such increase in the current I1 will increase the static current and therefore increase the static power consumption.

In addition to the problems mentioned above, the switch circuit 104A of FIG. 1 further has the following problems. When an overcurrent occurs and charges in the gate of each of the transistors M3' and M4' need to be removed through the current source I11, a response speed still has a bottleneck. When an electrical current outputted to the power domain 105B is very low, since the transistor M3' and the transistor M4' have different bias states (that is, a drain voltage of the transistor M3' may be different from a drain voltage of the transistor M4'), in a current path from the transistor M2' through the transistor M3' to the current source I10, a voltage at the node n3 cannot effectively follow a magnitude of the output voltage $V_{DD0}$ and will generate a biased current in the current path from the transistor M2' to the transistor M3' even though the electrical current outputted to the power domain 105B is already very low. Thus, it has become an important task for industries to provide a control circuit for a power switch, which prevents the above problems and is able to switch a power supply path to provide overcurrent protection for internal elements of an electronic device.

Figure 2:
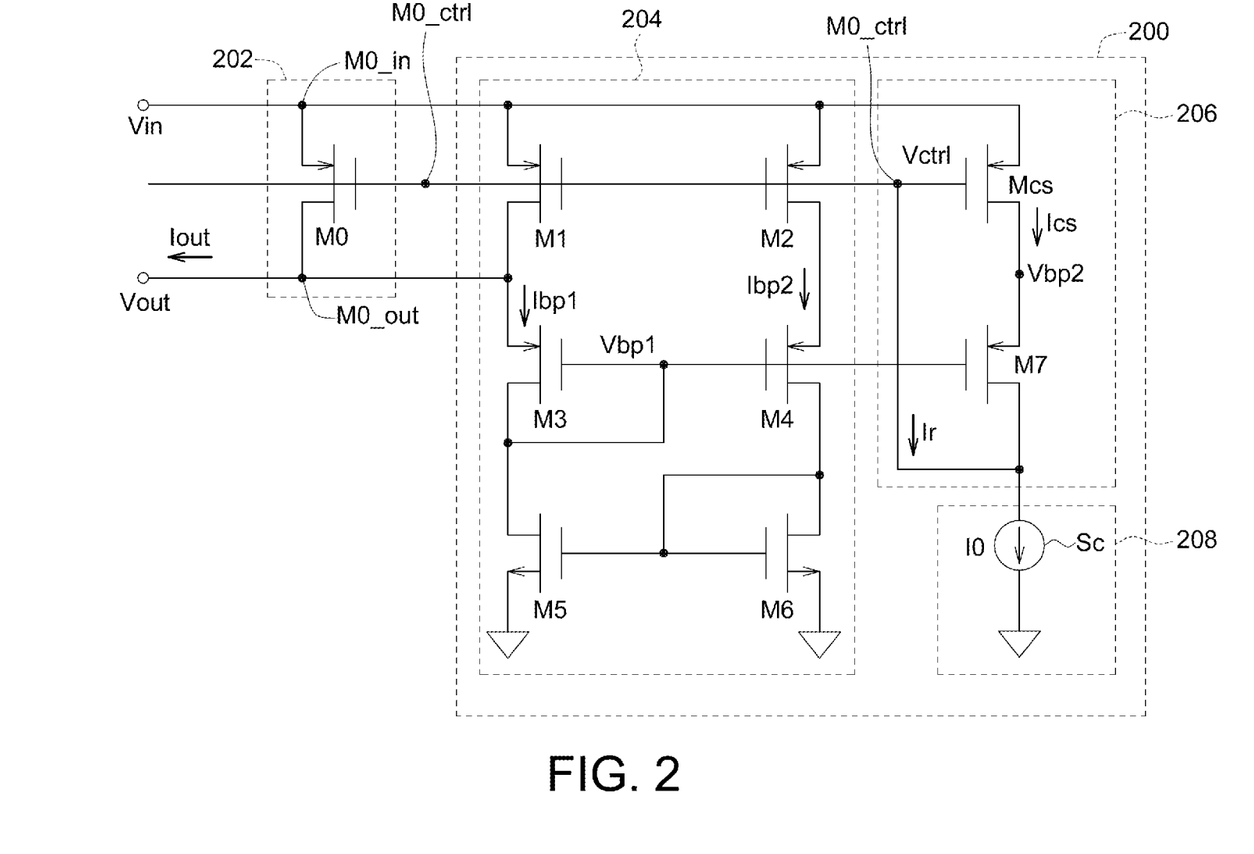
FIG. 2 is a circuit diagram of a control circuit according to an embodiment of the present disclosure.

Referring to FIG. 2, a circuit diagram of a control circuit 200 according to an embodiment of the present disclosure is shown. The control circuit 200 is used for a main switch 202. The main switch 202 has a main input end M0_in, a main output end M0_out, and a main control end M0_ctrl. The main input end M0_in receives an input voltage Vin. The main output end M0_out generates an output voltage Vout and supplies an output current Iout. The control circuit 200 includes an output voltage tracker 204, a main switch bias generator 206, and a reference current device 208.

The output voltage tracker 204 is coupled to the main output end M0_out and is configured to generate a first tracking voltage Vbp1. The output voltage tracker 204 has a consuming current Ibp. The first tracking voltage Vbp1 is positively correlated to the output voltage Vout. When the output voltage Vout decreases, the first tracking voltage Vbp1 decreases accordingly.

The main switch bias generator 206 includes a duplicating switching element Mcs. A second end and a control end of the duplicating switching element Mcs are coupled to the main input end M0_in and the main control end M0_ctrl respectively. The main switch bias generator 200, in response to the first tracking voltage Vbp1, generates a second tracking voltage Vbp2 substantially equal to the output voltage Vout. The second tracking voltage Vbp2 is a voltage at a first end of the duplicating switching element Mcs.

The reference current device 208 is coupled to the main switch bias generator 206 and is configured to generate a control voltage Vctrl on the main control end M0_ctrl. The reference current device 208 further turns on the main switch 202 by the control voltage Vctr. The reference current device 208 is configured to limit the maximum value of the output current Iout.

For example, the main switch 202 has a transistor M0, which can be implemented by a P-type metal-oxide-semiconductor field-effect transistor (MOSFET). The main input end M0_in is, for example, source of the transistor M0. The main output end M0_out is, for example, drain of the transistor M0. The main control end M0_ctrl is, for example, gate of the transistor M0. The duplicating switching element Mcs can also be implemented by a P-type MOSFET. The first end, the second end and the control end of the duplicating switching element Mcs are, for example, drain, source and gate of the duplicating switching element Mcs respectively.

The transistor M0 and the duplicating switching element Mcs form a current mirror configuration circuit, which uses the main control end M0_ctrl as a current mirror input end and uses the main output end M0_out as a current mirror output end. The consuming current Ibp of the output voltage tracker 204 is positively correlated to the output current Iout. When the output current Iout increases, the consuming current Ibp increases accordingly.

Thus, when abnormality occurs and makes the main output end M0_out of the main switch 202 become grounded or nearly grounded and generate a large output current Iout, the reference current device 208 can limit a maximum value of the output current Iout and protect the main switch 202 from being burned by overcurrent and therefore achieve overcurrent protection (OCP). Detailed operations of the control circuit 200 of FIG. 2 are disclosed below.

An ordinary portable device (such as a mobile phone or a Bluetooth earbud) include a plurality of main switches 202 for being connected to different power sources. For example, one of the main switches 202 is coupled to an external power source to provide power to each element of the portable device, Another one of the main switches 202 is coupled to an internal power source, such as a re-chargeable battery of the portable device. Thus, whether the external power source or the internal power source is used as the power source to supply power to the portable device is determined according to which main switch 202 is turned on. Let the Bluetooth earbud be taken for example. When the Bluetooth earbud is connected to the external power source which provides power to the Bluetooth earbud, the Bluetooth earbud turns on the one of the main switches 202 which is coupled to the external power source and enables the external power source to provide necessary power to the Bluetooth earbud and further charge the internal battery in the Bluetooth earbud. When the Bluetooth earbud is not connected to the external power source, the Bluetooth earbud turns on the another one of the main switches 202 which is coupled to the internal battery of the Bluetooth earbud and makes the internal re-chargeable battery of the Bluetooth earbud provide necessary power for operations of the internal elements of the Bluetooth earbud, Further, by coupling a control circuit 200 to one of the main switches 202 coupled to the external power source and by coupling another control circuit 200 to another one of the main switches 202 coupled to the internal power source, overcurrent protection can be provided to one of the main switches 202 coupled to the external power source and another one of the main switches 202 coupled to the internal power source.

In the control circuit 200 of FIG. 2, since gate of the transistor M0 of the main switch 202 is electrically connected to gate of the duplicating switching element Mcs and source of the transistor M0 is electrically connected to source of the duplicating switching element Mcs, the transistor M0 and the duplicating switching element Mcs form a current mirror configuration circuit. Thus, when the transistor M0 works in a triode region, the transistor M0 is used as a linear switch for coupling elements of a device to the internal power source or the external power source to provide the elements of the device with stable voltage source and necessary current as mentioned above. Meanwhile, a cross voltage between the main input end M0_in and the main output end M0_out of the transistor M0 is low, such as a few tens of mV. When the transistor M0 works in a saturation region, in which the transistor M0 needs to provide a relatively high current outputted to the main output end M0_out to generate an output voltage Vout, a voltage at the main output end M0_out will decrease. Meanwhile, a magnitude of the output current Iout is substantially equal to a fixed multiple of a magnitude of a duplicating switching element current Ics flowing through the duplicating switching element Mcs. Suppose the transistor M0 and the duplicating switching element Mcs have an aspect ratio of R1, then the magnitude of the output current Iout is substantially equal to R1 times of the magnitude of the duplicating switching element current Ics flowing through the duplicating switching element Mcs. That is, if a channel width and a channel length of the transistor M0 are respectively Wa and La, and a channel width and a channel length of the duplicating switching element Mcs are represented Wb and Lb, then a ratio of a magnitude of the output current Iout to a magnitude of the duplicating switching element current Ics can be expressed as Wa/La: Wb/Lb=R1.

Details of operation of the output voltage tracker 204 are disclosed below. The output voltage tracker 204 includes a first transistor M1 to a sixth transistor M6. The control end of each of the first transistor M1 and the second transistor M2 is coupled to the main control end M0_ctrl. A second end of the first transistor M1 and a second end of the second transistor M2 are coupled to the main input end M0_in. The third transistor M3 is a diode-connected transistor. A second end of the diode-connected third transistor M3 is electrically connected to a first end of the first transistor M1 and is coupled to the main output end M0_out. A control end of the diode-connected third transistor M3 is used to provide the first tracking voltage Vbp1.

The control end of the third transistor M3 is coupled to a control end of the fourth transistor M4. The second end of the third transistor M3 is coupled to the first end of the first transistor M1. A second end of the fourth transistor M4 is coupled to a first end of the second transistor M2. The control end of the third transistor M3 is further coupled to a first end of the third transistor M3. A voltage at the control end of the third transistor M3 is used as the first tracking voltage Vbp1. The consuming current Ibp of the output voltage tracker 204 is a sum of a consuming current Ibp1 flowing to the second end of the third transistor M3 from the first end of the first transistor M1 and a consuming current Ibp2 flowing to the second end of the fourth transistor M4 from the first end of the second transistor M2.

The first transistor M1 to the fourth transistor M4 are P-type transistors. The first end, the second end and the control end of each of the first transistor M1 to the fourth transistor M4 are drain, source, and gate of transistor, respectively. The first end of the first transistor M1 and the second end of the third transistor M3 are coupled to the main output end M0_out.

Furthermore, the outputvoltage tracker 204 further includes a fifth transistor M5 and a sixth transistor M6. A control end of the fifth transistor M5 is coupled to a control end of the sixth transistor M6. The control end of the sixth transistor M6 is coupled to a first end of the sixth transistor M6. A first end of the fifth transistor M5 is coupled to the first end of the third transistor M3. A first end of the sixth transistor M6 is coupled to the first end of the fourth transistor M4.

The fifth transistor M5 and the sixth transistor M6 both are N-type transistors. The first end of each of the fifth transistor M5 and the sixth transistor M6 both are drain of transistor. A second end of the fifth transistor M5 and a second end of the sixth transistor M6 both are source of transistor. The control end of each of the fifth transistor M5 and the sixth transistor M6 is gate of transistor. The second end of each of the fifth transistor M5 and the sixth transistor M6 is coupled to a reference voltage.

In the main switch bias generator 206, the main switch bias generator 206 further includes a seventh transistor M7. A control end of the seventh transistor M7 is coupled to the control end of the third transistor M3. A second end of the seventh transistor M7 is coupled to the first end of the duplicating switching element Mcs. A first end of the seventh transistor M7 is coupled to the reference current device 208. The seventh transistor M7 is a P-type transistor. The first end, the second end and the control end of the seventh transistor M7 are drain, source, and gate of transistor, respectively, The reference current device 208 can be, for example, implemented by a current source Sc. The current source Sc is coupled to the first end of the transistor M7 and is electrically connected to the control end of the duplicating switching element Mcs. The current Ir is a current flowing to the reference current device 208 from the control end of the duplicating switching element Mcs. The current Ir will pull down a voltage at the main control end M0_ctrl, that is, a voltage at each of the control ends of the transistor M1, the transistor M2, and the duplicating switching element Mcs. For example, a voltage at the main control end M0_ctrl is pulled down to 0V, such that the P-type transistors M1 and M2, and the duplicating switching element Mcs are turned on, A sum of the current Ir and the duplicating switching element current Ics is equal to the current I0 of the current source Sc.

When the transistor M0 is turned on and a required current outputted from the transistor M0 is low, a value of the output voltage Vout is almost equal to a value of the input voltage Vin (that is, the second tracking voltage Vbp2 is close to the input voltage Vin), and the duplicating switching element current Ics of the duplicating switching element Mcs is far smaller than the current I0 of the current source Sc. Therefore, the current Ir will pull down the control voltage Vctrl to near 0V. When a cross voltage of the current source Sc decreases, the current I0 of the current source Sc will decrease until the current Ir, the duplicating switching element current Ics, and the current I0 of the current source Sc are balanced. At this time, the current I0 of the current source Sc is small, and the control voltage Vctrl is near 0V. That is, the control circuit of the present embodiment still can effectively turn on the transistor M0 which is used as a switch even under the situation when the consuming current is extremely low.

A value of the first tracking voltage Vbp1 at gate of the transistor M3 is obtained by subtracting a value of the cross voltage Vsg1 between source of and gate the transistor M3 from a value of the output voltage Vout. A value of the second tracking voltage Vbp2 at source of the transistor M7 is obtained by adding the value of the cross voltage Vsg2 between source of and gate of the transistor M7 to the value of the first tracking voltage Vbp1 . In the circumstance that the value of the cross voltage Vsg1 is almost equal to the value of the cross voltage Vsg2, the value of the second tracking voltage Vbp2 is substantially equal to the output voltage Vout. The second tracking voltage Vbp2 is used as the tracking voltage of the output voltage Vout.

Let a magnitude of the output current Iout be substantially equal to R1 times of a magnitude of the duplicating switching element current Ics flowing through the duplicating switching element Mcs (that is, Iout=Ics×R1), for example, When the main output end M0_out of the transistor M0 is short-circuited and grounded, a large current flows from the main output end M0_out. That is, the output current Iout is a high current. When the output current Iout increases, the duplicating switching element current Ics increases accordingly due to that the second tracking voltage Vbp2 is substantially equal to the output voltage Vout. When a value of the duplicating switching element current Ios is increased to a value of the current I0 of the current source Sc, the current Ir is almost equal to 0, and the magnitude of the output current Iout is substantially equal to R1 times of the magnitude of the duplicating switching element current Ics, that is, the R1 times of the current I0. Since the transistor M0, the transistor M1, the transistor M2, and the duplicating switching element Mcs form current mirror configuration, the magnitude of the output current Iout is limited to R1 times of the magnitude of the duplicating switching element current Ics, that is, R1 times of the current I0. That is, the limited amount of electrical current of the output current Iout is the limited amount of FR1 times of current I0 (R1×I0). Thus, with the output current Iout having the limited amount of R1×I0, the situation that an overcurrent is outputted from the main output end M0_out and burns the transistor M0 can be prevented and overcurrent protection can be achieved.

The transistor M5 and the transistor M6 form a current mirror. Because of the output voltage tracker 204, the transistor M1, the transistor M2, and the duplicating switching element Mcs are biased almost the same as the transistor M0. Therefore, a static current ratio of the transistor M1 to the transistor M0, a static current ratio of the transistor M2 to the transistor M0, and a static current ratio of the duplicating switching element Mcs to the transistor M0 are equal to each other. The static current ratio is such as 1/R1. When the output current Iout reaches the maximum value (that is, R1×I0), the output current Iout of the transistor M0 is limited to R1×I0.

Moreover, when the output current Iout becomes a high current suddenly, a current flowing through each of the transistor M1, the transistor M2, and the duplicating switching element Mcs quickly increases, such that the duplicating switching element current Ios is quickly increased to the current I0 of the current source Sc. Therefore, the maximum value of the output current Iout is limited to R1×I0. In comparison to the switch circuit 104A of FIG. 1, the control circuit 200 of the present disclosure has a faster response speed when overcurrent occurs.

Since the control circuit 200 of the above embodiment does not have high-impedance nodes, circuit reliability can be improved, and the issue of loop stability can be avoided. Furthermore, since circuit design does not need to consider the issue of loop stability, design complexity can be reduced.

Besides, the reference current device disclosed above can be any element capable of generating a current path. For example, the reference current device can be implemented by a resistor or a transistor, such as a bipolar junction transistor (BJT) or a metal-oxide-semiconductor field-effect transistor (MOSFET). The disclosure below is exemplified by the embodiments in which the reference current device is implemented by a resistor.

Figure 3:
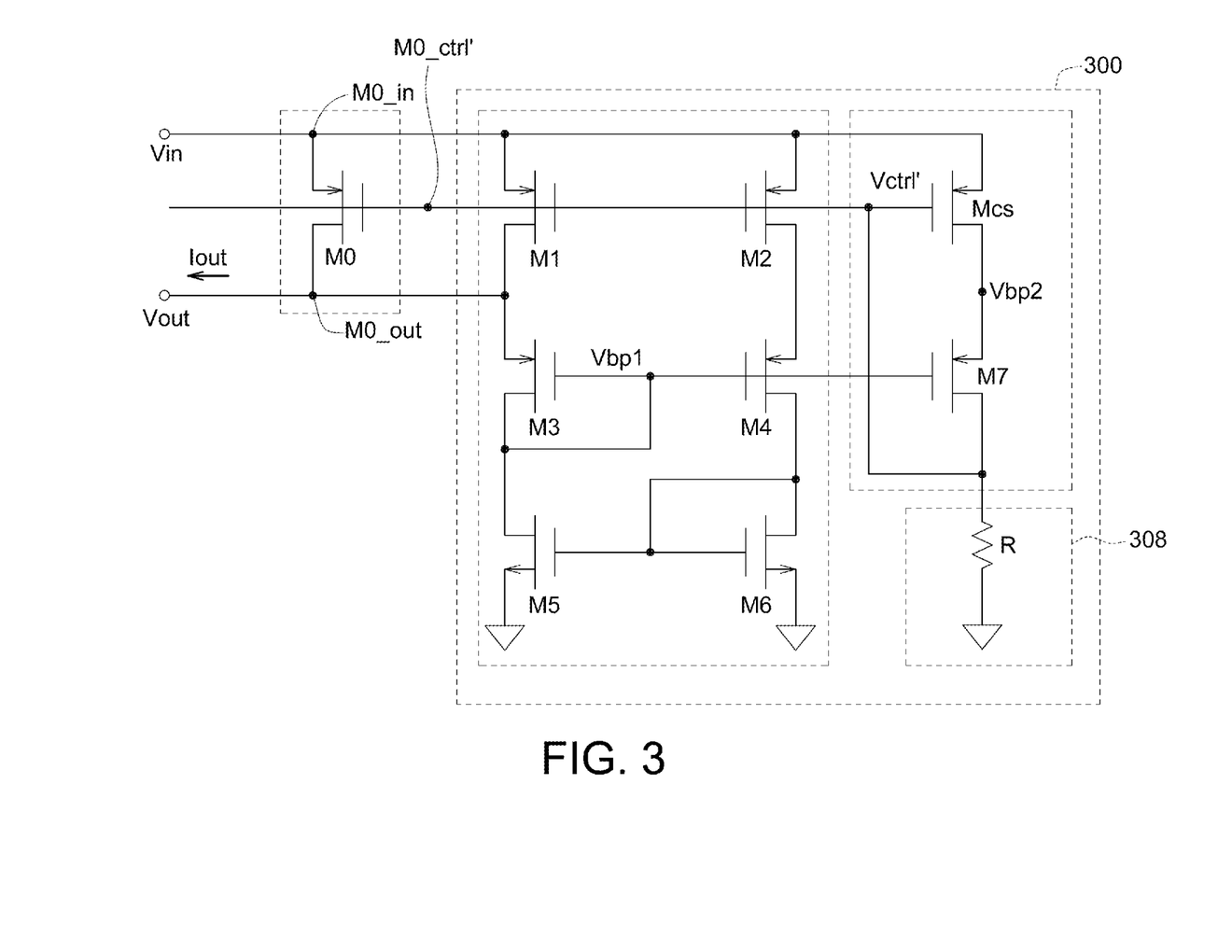
FIG. 3 is a circuit diagram of a control circuit according to another embodiment of the present disclosure.

Referring to FIG. 3, a circuit diagram of a control circuit 300 according to another embodiment of the present disclosure is shown. The control circuit 300 of FIG. 3 is different from the control circuit 200 of FIG. 2 in that the reference current device 308 is implemented by a resistor R. A first end of the resistor R is coupled to the main control end M0_ctrl', and a second end of the resistor R is coupled to a reference voltage. The cross voltage between the control voltage Vctrl' of the main control end M0_ctrl' and the reference voltage determines a magnitude of a current flowing through the resistor R. The current flowing through the resistor R replaces the current I0 of the current source Sc of FIG. 2.

Figure 4:
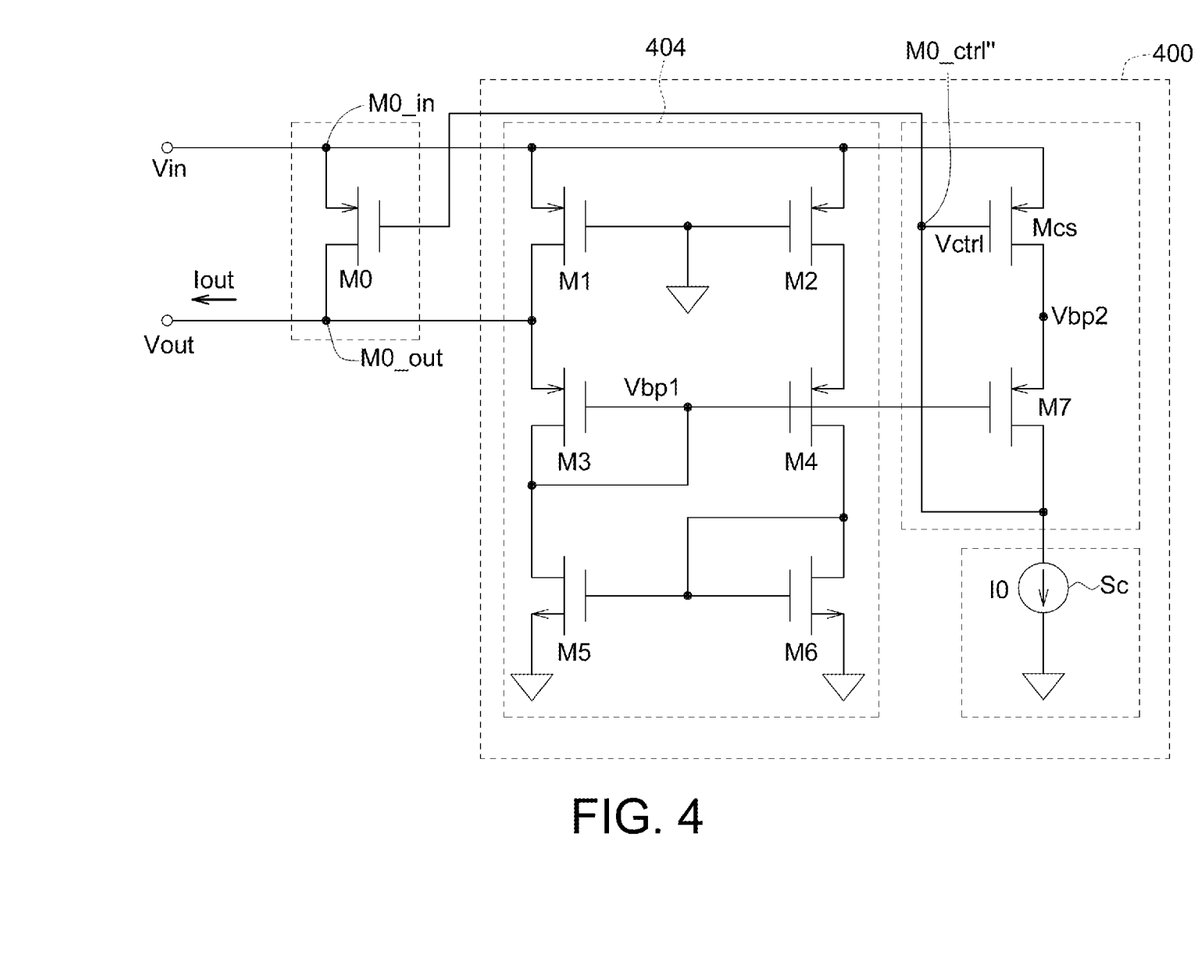
FIG. 4 is a circuit diagram of a control circuit according to a further embodiment of the present disclosure.

Referring to FIG. 4, a circuit diagram of a control circuit 400 according to a further embodiment of the present disclosure is shown. The control circuit 400 of FIG. 4 is different from the control circuit 200 of FIG. 2 in that a control end of each of the transistors M1 and M2 is grounded, and a control end of the transistor M0 is coupled to a control end of the duplicating switching element Mcs and is used as a main control end M0_ctrl". With the control ends of the P-type transistor M1 and the P-type transistor M2 which are grounded, the transistors M1 and M2 can be maintained in a turned-on state, such that an output voltage tracker 404 can be maintained at an operating state, and the control circuit 400 can provide overcurrent protection to the transistor M0.

Figure 5A:
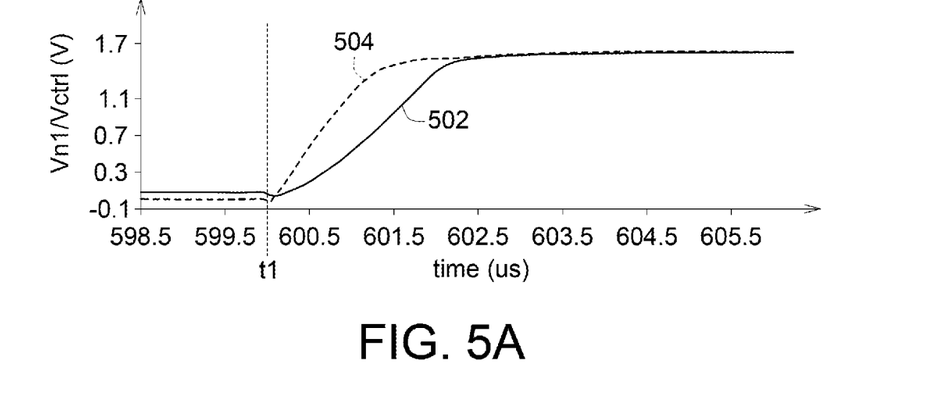
FIG. 5A to FIG. 5C are diagrams of simulation comparison between the control circuit of FIG. 2 and the switch circuit of FIG. 1.
Figure 5B:
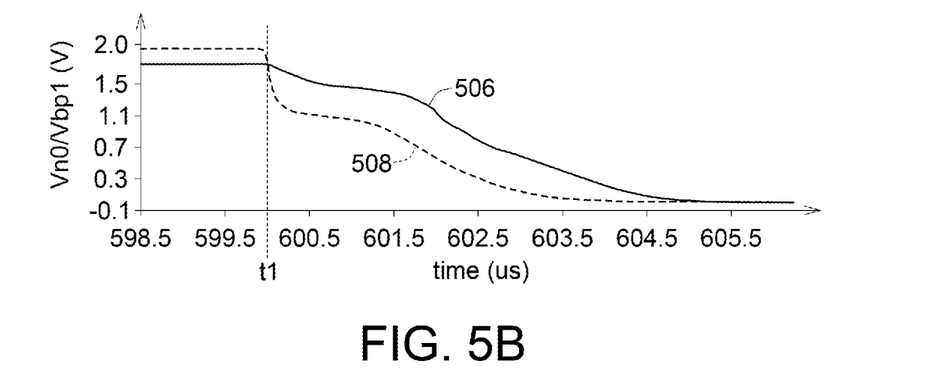
Figure 5C:
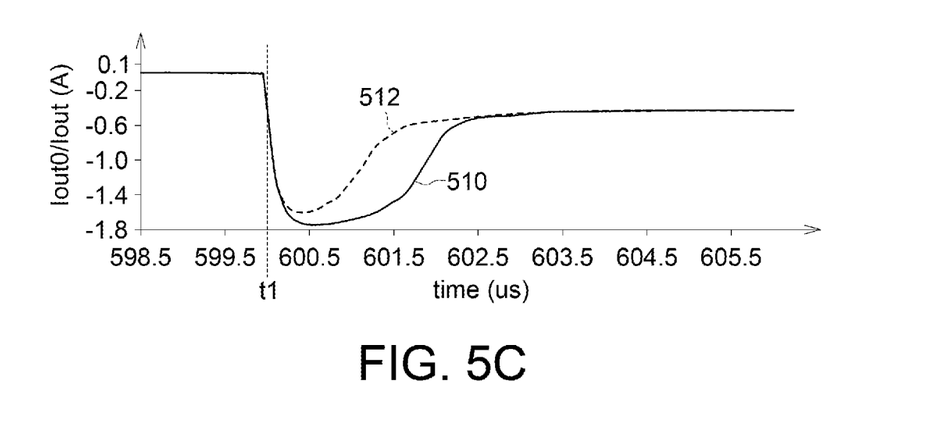

Referring to FIG. 5A to FIG. 5C, diagrams of simulation comparison between the control circuit of FIG. 2 and the switch circuit 104A of FIG. 1 are shown, FIG. 5A illustrates a simulation comparison between a voltage Vn1 (waveform 502) at a node n1 of the switch circuit 104A of FIG. 1 and the control voltage Vctrl (waveform 504) of the control circuit 200 of FIG. 2. FIG, 5B illustrates a simulation comparison between a voltage Vn0 (waveform 506) at a node n0 of the switch circuit 104A of FIG. 1 and the first tracking voltage Vbp1 (waveform 508) of the control circuit 200 of FIG. 2. FIG. 5C illustrates a simulation comparison between a current Iout0 (waveform 510) outputted to the power domain 105B from the switch circuit 104A of FIG. 1 and the output current Iout (waveform 512) of the control circuit 200 of FIG. 2.

As indicated in FIG. 5A, at time point t1, when an output end is short-circuited and grounded and generates an overcurrent, in comparison to the waveform 502, which illustrates the voltage Vn1 at the node n1 of the switch circuit 104A of FIG. 1, the waveform 504, which illustrates the control voltage Vctrl of the control circuit 200 of FIG. 2, reaches stable voltage more quickly and is helpful in timely limiting a magnitude of an output current. As indicated in FIG. 5B, in comparison to the waveform 506, which illustrates the voltage Vn0 at the node n0 of the switch circuit 104A of FIG. 1, the waveform 508, which illustrates the first tracking voltage Vbp1 of the control circuit 200 of FIG. 2, has a faster response speed and reaches stable voltage more quickly. Combining the effect that the control voltage Vctrl reaches stable voltage more quickly and the effect that the first tracking voltage Vbp1 has a faster response speed as illustrated in FIGS. 5A and 5B, the response speed and a peak value of the limited amount of electric current of the output current Iout of the control circuit 200 of FIG. 2 of the present embodiment are shown in the waveform 512. In comparison to the waveform 510, which illustrates the current Iout0 outputted to the power domain 105E from the switch circuit 104, of FIG. 1, the waveform 512, which illustrates the output current Iout of the control circuit 200 of FIG. 2, has a smaller peak value (in absolute value) of the limited amount of electric current, reaches stable current more quickly, and has a faster response speed.

Based on the simulation result, under the same design constraint in which the current I0 defined by the reference current device is set to 128 uA, and is amplified by 2560 times and used as the limited amount of electrical current, when the output current Iout is almost equal to 0, the switch circuit 104A of FIG. 1 has a larger static current (greater than 80 uA), but the control circuit 200 of FIG. 2 has a smaller static current (smaller than 10 uA). Thus, in comparison to the switch circuit 104A of FIG. 1, the control circuit 200 of FIG. 2 advantageously has a smaller static current and lower static power consumption.

As disclosed above, the control circuit of the preferred embodiment of the present disclosure advantageously has a faster response speed, smaller shift in the limited amount of electrical current, and a smaller static current. When an over current occurs, the control circuit of the preferred embodiment of the present disclosure can rapidly and effectively avoid the overcurrent causing damage to the elements of the device. Furthermore, in normal circumstance where no overcurrent occurs, the control circuit of the preferred embodiment of the present disclosure consumes a smaller amount of static power, and therefore achieves power saving.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A control circuit for a main switch wherein the main switch has a main input end, a main output end and a main control end, the main input end receives an input voltage, the main output end generates an output voltage and supplies an output current, and the control circuit comprises:
    an output voltage tracker, coupled to the main output end and configured to generate a first tracking voltage, wherein the output voltage tracker has a consuming current, the first tracking voltage is positively correlated to the output voltage, and when the output voltage decreases, the first tracking voltage decreases accordingly;
    a main switch bias generator, comprising a duplicating switching element, wherein a second end and a control end of the duplicating switching element are coupled to the main input end and the main control end respectively, the main switch bias generator, in response to the first tracking voltage, generates a second tracking voltage substantially equal to the output voltage, and the second tracking voltage is the voltage at a first end of the duplicating switching element; and
    a reference current device, coupled to the main switch bias generator and configured to generate a control voltage on the main control end, wherein the reference current device further turns on the main switch by the control voltage and is configured to limit a maximum value of the output current;
    wherein the main switch and the duplicating switching element form a current mirror configuration circuit, the current mirror configuration circuit uses the main control end as a current mirror input end and uses the main output end as a current mirror output end;
    wherein the consuming current of the output voltage tracker is positively correlated to the output current, and when the output current increases, the consuming current increases accordingly.

2. The control circuit according to claim 1, wherein a magnitude of the output current is substantially equal to a fixed multiple of a magnitude of a duplicating switching element current flowing through the duplicating switching element.

3. The control circuit according to claim 1, wherein the output voltage tracker comprises a first transistor, and a control end of the first transistor is coupled to the main control end.

4. The control circuit according to claim 3, wherein the output voltage tracker further comprises a diode-connected transistor, a second end of the diode-connected transistor is electrically connected to a first end of the first transistor and is coupled to the main output end, and a control end of the diode-connected transistor is configured to provide the first tracking voltage.

5. The control circuit according to claim 1, wherein the output voltage tracker comprises:
    a first transistor and a second transistor, wherein a control end of the first transistor and a control end of the second transistor are coupled to the main control end, and a second end of the first transistor and a second end of the second transistor are coupled to the main input end; and
    a third transistor and a fourth transistor, wherein a control end of the third transistor is coupled to a control end of the fourth transistor, a second end of the third transistor is coupled to a first end of the first transistor, a second end of the fourth transistor is coupled to a first end of the second transistor, and the control end of the third transistor is further coupled to a first end of the third transistor;
    wherein a voltage at the control end of the third transistor is used as the first tracking voltage, the consuming current is a sum of a current flowing to the second end of the third transistor from the first end of the first transistor and a current flowing to the second end of the fourth transistor from the first end of the second transistor.

6. The control circuit according to claim 5, wherein the first transistor to the fourth transistor are a P-type transistor, the fourth transistor has a first end, the first end of each of the first transistor to the fourth transistor is drain of the P-type transistor, the second end of each of the first transistor to the fourth transistor is source of the P-type transistor, and the control end of each of the first transistor to the fourth transistor is gate of the P-type transistor.

7. The control circuit according to claim 5, wherein the first end of the first transistor and the second end of the third transistor are coupled to the main output end.

8. The control circuit according to claim 5, wherein the output voltage tracker further comprises a fifth transistor and a sixth transistor, a control end of the fifth transistor is coupled to a control end of the sixth transistor, the control end of the sixth transistor is coupled to a first end of the sixth transistor, a first end of the fifth transistor is coupled to the first end of the third transistor, and a first end of the sixth transistor is coupled to a first end of the fourth transistor.

9. The control circuit according to claim 8, wherein the fifth transistor and the sixth transistor are an N-type transistor, the first end of the fifth transistor and the first end of the sixth transistor are drain of the N-type transistor, a second end of the fifth transistor and a second end of the sixth transistor are source of the N-type transistor, the control end of the fifth transistor and the control end of the sixth transistor are gate of the N-type transistor, and the second end of the fifth transistor and the second end of the sixth transistor are coupled to a reference voltage.

10. The control circuit according to claim 5, wherein the control end of the first transistor and the control end of the second transistor are grounded.

11. The control circuit according to claim 5, wherein the main switch bias generator has a seventh transistor, a control end of the seventh transistor is coupled to the control end of the third transistor, a second end of the seventh transistor is coupled to the first end of the duplicating switching element, and a first end of the seventh transistor is coupled to the reference current device.

12. The control circuit according to claim 11, wherein the seventh transistor is a P-type transistor, the first end of the seventh transistor is drain of the P-type transistor, the second end of the seventh transistor is source of the P-type transistor, and the control end of the seventh transistor is gate of the P-type transistor.

13. The control circuit according to claim 1, wherein the reference current device is implemented by a resistor, a first end of the resistor is coupled to the main control end, and a second end of the resistor is coupled to a reference voltage.

* * * * *